(12) United States Patent
Inaba et al.

(10) Patent No.: US 10,217,885 B2
(45) Date of Patent: Feb. 26, 2019

(54) INTERCONNECTOR AND SOLAR PANEL

(71) Applicants: KABUSHIKI KAISHA TOYOTA JIDOSHOKKI, Kariya-shi, Aichi-ken (JP); TOYOTA JIDOSHA KABUSHIKI KAISHA, Toyota-shi, Aichi-ken (JP)

(72) Inventors: Hirotaka Inaba, Kariya (JP); Shoichi Iwamoto, Izunokuni (JP); Hiroyuki Ohba, Shizuoka-ken (JP)

(73) Assignees: KABUSHIKI KAISHA TOYOTA JIDOSHOKKI, Kariya-shi, Aichi-ken (JP); TOYOTA JIDOSHA KABUSHIKI KAISHA, Toyota-shi, Aichi-ken (JP)

(*) Notice: Subject to any disclaimer, the term of this patent is extended or adjusted under 35 U.S.C. 154(b) by 0 days.

(21) Appl. No.: 15/665,720

(22) Filed: Aug. 1, 2017

(65) Prior Publication Data

US 2018/0040755 A1 Feb. 8, 2018

(30) Foreign Application Priority Data

Aug. 8, 2016 (JP) ................................ 2016-155359

(51) Int. Cl.
*H01L 31/05* (2014.01)
*H01L 31/049* (2014.01)
*H01L 31/048* (2014.01)

(52) U.S. Cl.
CPC ........ *H01L 31/0508* (2013.01); *H01L 31/048* (2013.01); *H01L 31/049* (2014.12); *H01L 31/0488* (2013.01); *H01L 31/0504* (2013.01); *H01L 31/0512* (2013.01); *H01L 31/0516* (2013.01)

(58) Field of Classification Search
CPC ............. H01L 31/0504; H01L 31/0508; H01L 31/0516; H01L 31/05
See application file for complete search history.

(56) References Cited

U.S. PATENT DOCUMENTS

2009/0145478 A1* 6/2009 Takahashi ................ C08J 7/045
136/256
2011/0067746 A1* 3/2011 Okubo ................ H01L 27/1421
136/244

(Continued)

FOREIGN PATENT DOCUMENTS

DE 10 2006 019 638 A1 11/2007
EP 1 947 703 A1 7/2008

(Continued)

OTHER PUBLICATIONS

Communication dated Dec. 12, 2017 from the European Patent Office in counterpart Application No. 17184886.4.

*Primary Examiner* — Susan D Leong
(74) *Attorney, Agent, or Firm* — Sughrue Mion, PLLC (57) ABSTRACT

An interconnector includes a first electrode configured to be connected to a first photovoltaic cell, a second electrode configured to be connected to a second photovoltaic cell, and a connection body that connects the first electrode and the second electrode. The connection body includes a first detour, a second detour, and a joint. The first detour includes a first curved part that is curved toward a first side in a first direction and connected to the first electrode.

11 Claims, 8 Drawing Sheets

(56) References Cited

U.S. PATENT DOCUMENTS

| | | | | |
|---|---|---|---|---|
| 2011/0240337 A1* | 10/2011 | Montello | ............ | H01L 31/0508 |
| | | | | 174/126.1 |
| 2014/0124014 A1* | 5/2014 | Morad | .................. | H01L 31/042 |
| | | | | 136/246 |
| 2017/0012576 A1 | 1/2017 | Inaba et al. | | |

FOREIGN PATENT DOCUMENTS

| | | |
|---|---|---|
| JP | 2005-191479 A | 7/2005 |
| JP | 2013-030655 A | 2/2013 |
| WO | 2013/018533 A1 | 2/2013 |

\* cited by examiner

INTERCONNECTOR AND SOLAR PANEL

BACKGROUND

The present invention relates to an interconnector and a solar panel.

Japanese Laid-Open Patent Publication No. 2005-191479 discloses a prior art solar panel. The solar panel includes a protection cover, a back cover, a first photovoltaic cell, a second photovoltaic cell, an interconnector, and an encapsulation member.

The protection cover is formed by an inorganic glass and transparent from an upper surface to a lower surface of the protection cover. The back cover is formed by a resin film or the like. The first photovoltaic cell and the second photovoltaic cell are located adjacent to each other in a first direction. More specifically, the first photovoltaic cell is located at one side in the first direction. The second photovoltaic cell is located at the other side in the first direction.

The interconnector is flat. The interconnector is located between the first photovoltaic cell and the second photovoltaic cell to be parallel to the first photovoltaic cell and the second photovoltaic cell. The interconnector includes a first electrode connected to the first photovoltaic cell, a second electrode connected to the second photovoltaic cell, and a joint that connects the first electrode and the second electrode. The first photovoltaic cell, the second photovoltaic cell, and the interconnector, which are located between the protection cover and the back cover, are encapsulated and fixed to one another by the encapsulation member.

In the solar panel, the first photovoltaic cell and the second photovoltaic cell, which are adjacent to each other in the first direction, are electrically connected to each other by the interconnector.

This type of solar panel may be expanded and contracted by changes in the temperature that occur when the solar panel is manufactured or used. This changes the interval between the first photovoltaic cell and the second photovoltaic cell, which are adjacent to each other. Therefore, when the interval of the first photovoltaic cell and the second photovoltaic cell is narrowed by the contraction of the solar panel caused by changes in the temperature, the first photovoltaic cell and the second photovoltaic cell apply a compression load to the interconnector. More specifically, the interconnector is pressed by the first photovoltaic cell and the second photovoltaic cell from opposite sides. Such a load may break the interconnector in a thickness-wise direction. When the interval between the first photovoltaic cell and the second photovoltaic cell is widened by the expansion of the solar panel caused by changes in the temperature, the first photovoltaic cell and the second photovoltaic cell apply a tension load to the interconnector. More specifically, the interconnector is pulled by the first photovoltaic cell and the second photovoltaic cell from opposite sides. This may separate the first electrode from the first photovoltaic cell or the second electrode from the second photovoltaic cell.

Consequently, in the solar panel, the first photovoltaic cell and the second photovoltaic cell may be electrically disconnected from each other. Particularly, when the protection cover and the back cover are formed from a resin, the protection cover and the back cover each have a large thermal expansion coefficient. Thus, the above problem becomes more prominent.

SUMMARY

It is an object of the present invention to provide an interconnector and a solar panel that limit occurrence of defective electrical connections between a first photovoltaic cell and a second photovoltaic cell even when the solar panel is expanded and contracted by changes in the temperature.

To achieve the above object, an interconnector is configured to electrically connect a first photovoltaic cell and a second photovoltaic cell that are adjacent to each other in a first direction. The first photovoltaic cell is located at a first side in the first direction. The second photovoltaic cell is located at a second side in the first direction. The interconnector includes a first electrode configured to be connected to the first photovoltaic cell, a second electrode configured to be connected to the second photovoltaic cell, and a connection body that connects the first electrode and the second electrode. The connection body includes a first detour connected to the first electrode and extended toward a first side in a second direction that is orthogonal to the first direction, a second detour connected to the second electrode and extended toward the first side in the second direction, and a joint extended in the first direction to connect the first detour and the second detour. The first detour includes a first curved part that is curved toward the first side in the first direction and connected to the first electrode.

To achieve the above object, a solar panel includes the interconnector; the first photovoltaic cell; the second photovoltaic cell; a protection cover including an upper surface and a lower surface and is transparent from the upper surface to the lower surface; a back cover that cooperates with the protection cover to cover the first photovoltaic cell, the second photovoltaic cell, and the interconnector, which are located between the protection cover and the back cover; and an encapsulation member that encapsulates the first photovoltaic cell, the second photovoltaic cell, and the interconnector and fixes the first photovoltaic cell, the second photovoltaic cell, and the interconnector to one another.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION

First and second embodiments of the present invention will now be described with reference to FIGS. 1 and 2.

First Embodiment

Figure 1:
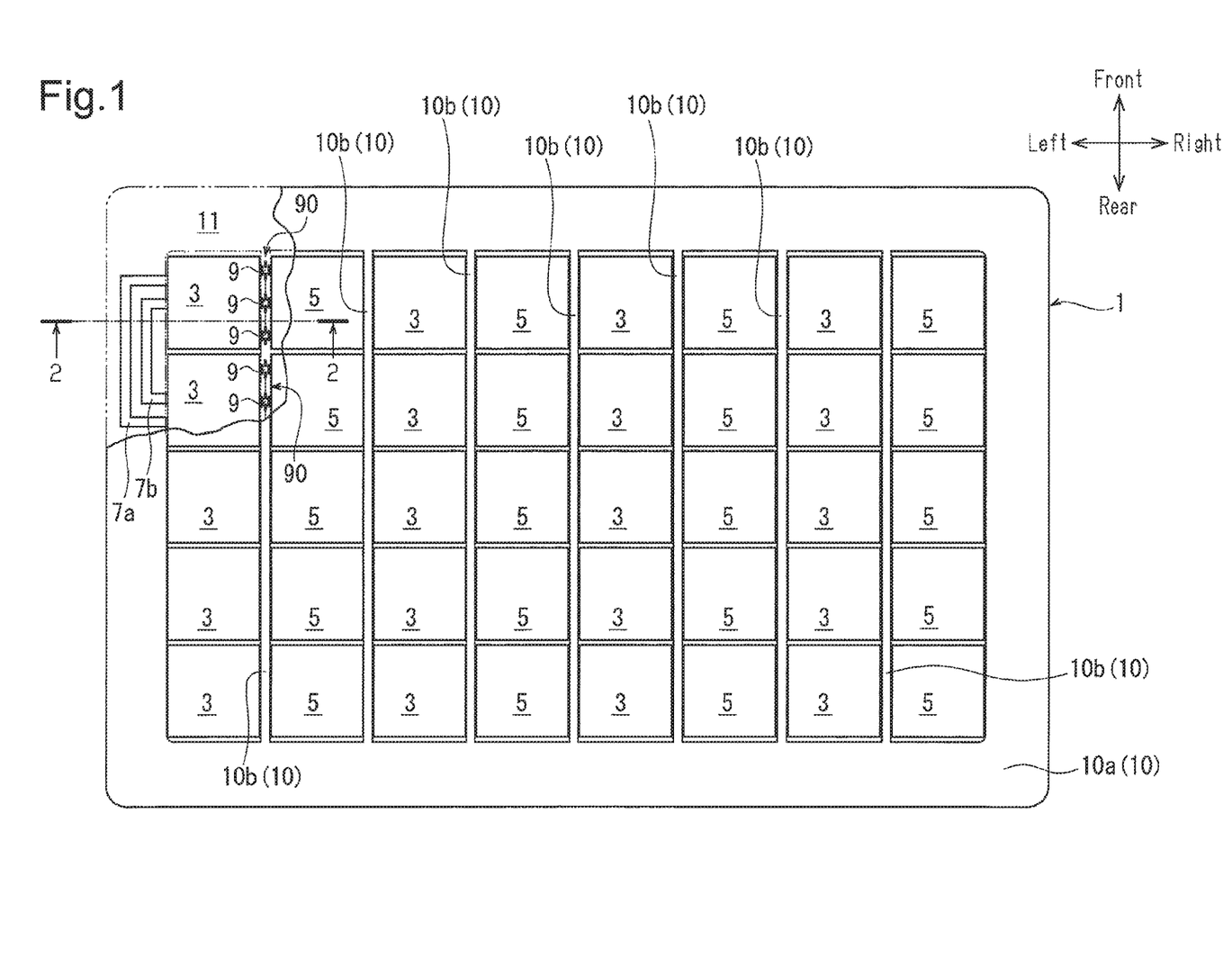
FIG. 1 is a top view showing a first embodiment of a solar panel.

As shown in FIG. 1, a first embodiment of a solar panel includes a protection plate 1, a plurality of first photovoltaic cells 3, a plurality of second photovoltaic cells 5, a plurality of tab wires 7a, 7b, a plurality of interconnectors 9, and an encapsulation member 11. As shown in FIG. 2, the solar panel further includes a back panel 13. The protection plate 1 corresponds to a protection cover. The back panel 13 corresponds to a back cover. To simplify the illustration, FIG. 1 does not show a portion of the protection plate 1 that is indicated by a broken line.

In the present embodiment, the directions indicated by arrows in FIG. 1 define a left-right direction and a front-rear direction of the solar panel. The left-right direction is orthogonal to the front-rear direction. In addition to the directions of the solar panel as defined in FIG. 1, the thickness-wise direction of the solar panel is defined as a vertical direction for example, referring to FIG. 2. The left-right direction of the solar panel corresponds to a first direction. More specifically, the left side corresponds to a first side (one side) in the first direction. The right side corresponds to a second side (the other side) in the first direction. The front-rear direction of the solar panel corresponds to a second direction. More specifically, the rear side corresponds to a first side (one side) in the second direction. The front side corresponds to a second side (the other side) in the second direction. These directions are examples for facilitating understanding and not related to the directions of the solar panel when installed.

Figure 2:
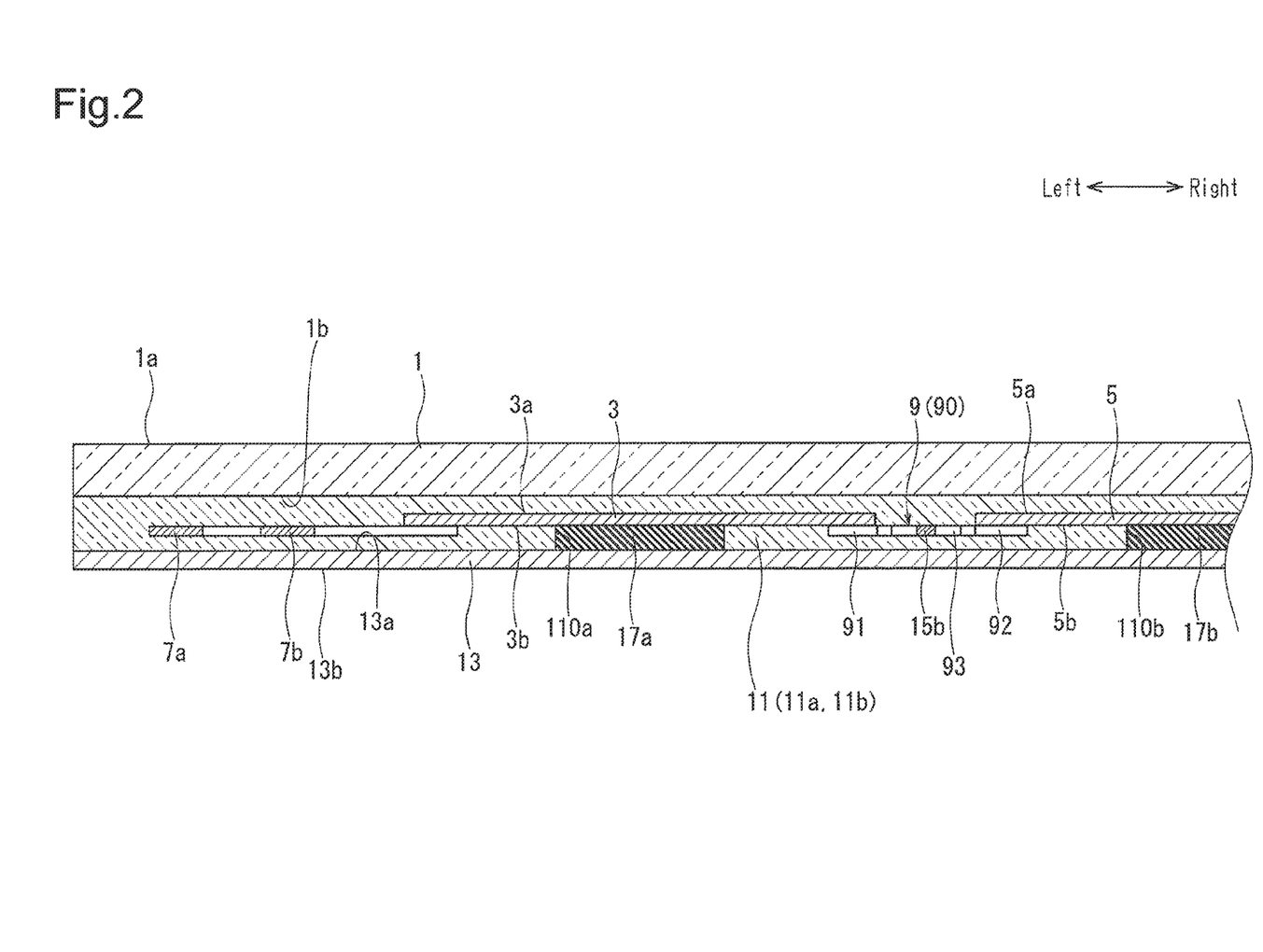
FIG. 2 is an enlarged cross-sectional view taken along line 2-2 in FIG. 1.

Referring to FIG. 2, the protection plate 1, which includes an upper surface 1a and a lower surface 1b, is formed from a resin, the main component of which is polycarbonate, and transparent from the upper surface 1a to the lower surface 1b. The upper surface 1a of the protection plate 1 defines an upper surface of the solar panel, that is, an ornamental surface of the solar panel. The upper surface 1a is flat and level. The lower surface 1b is also flat and parallel to the upper surface 1a. Thus, as shown in FIG. 1, the protection plate 1 is rectangular and flat. Alternatively, the protection plate 1 may be formed from, for example, another resin or an inorganic glass. Additionally, the protection plate 1 may be designed to have an appropriate thickness. The protection cover may be formed, for example, by a transparent protection film instead of the protection plate 1.

As shown in FIG. 1, the protection plate 1 includes a shield 10. The shield 10 includes a body portion 10a, which is configured to shield the tab wires 7a, 7b from the side of the upper surface 1a of the protection plate 1, and a plurality of connection portions 10b. The connection portions 10b are configured to shield the interconnectors 9 and first and second links 15a, 15b, which will be described later, from the side of the upper surface 1a.

The body portion 10a and the connection portions 10b are formed by painting predetermined positions of the lower surface 1b of the protection plate 1 with an opaque color such as black or printing the predetermined positions of the lower surface 1b in an opaque color such as black. More specifically, the body portion 10a is located on a position of the protection plate 1 defining an outer region of a photovoltaic cell group that includes the first photovoltaic cells 3 and the second photovoltaic cells 5. The body portion 10a is frame-shaped to surround the first and second photovoltaic cells 3, 5. Each of the connection portions 10b is located at an inner side of the body portion 10a and extended in the front-rear direction of the protection plate 1 to be continuous with a front end and rear end of the body portion 10a. The number of the connection portions 10b is set in accordance with the number of intervals between adjacent ones of the first photovoltaic cells 3 and the second photovoltaic cells 5 in the left-right direction. The size of the connection portions 10b is set in correspondence with the size of the interval between the first photovoltaic cell 3 and the second photovoltaic cell 5 that are adjacent to each other in the left-right direction, more specifically, the size of an interval W (refer to FIG. 3), which will be described later. To simplify the illustration, FIGS. 2 and 6 to 8 do not show the shield 10.

Each of the first photovoltaic cell 3 and the second photovoltaic cell 5, which are shown in FIG. 2, includes crystalline silicon. The first and second photovoltaic cells 3, 5 have the same structure and the same properties. More specifically, each of the first photovoltaic cells 3 has the form of a thin film and includes an upper surface 3a and a lower surface 3b. Also, each of the second photovoltaic cells 5 has the form of a thin film and includes an upper surface 5a and a lower surface 5b. The lower surfaces 3b of the first photovoltaic cells 3 and the lower surfaces 5b of the second photovoltaic cells 5 each include a conductive portion (not shown). Alternatively, the upper surfaces 3a of the first photovoltaic cells 3 and the upper surfaces 5a of the second photovoltaic cells 5 may each include a conductive portion.

As shown in FIG. 1, the first and second photovoltaic cells 3, 5 are arranged in a lattice in the front-rear and left-right directions of the solar panel. Additionally, the first photovoltaic cells 3 and the second photovoltaic cells 5 are alternately arranged adjacent to one another in the left-right direction. The size and number of the first and second photovoltaic cells 3, 5 may be changed in accordance with, for example, the size of the solar panel.

The tab wires 7a, 7b are formed by thin metal plates. The tab wires 7a, 7b are located at the right end or left end of the solar panel. The tab wires 7a, 7b are arranged at fixed intervals. The tab wires 7a, 7b may electrically connect the first photovoltaic cells 3 that are located in different rows in the front-rear direction. The tab wires 7a, 7b may electrically connect the second photovoltaic cells 5 that are located in different rows in the front-rear direction. The positions where the tab wires 7a, 7b are connected to the first photovoltaic cells 3 and the positions where the tab wires 7a, 7b are connected to the second photovoltaic cells 5 may be changed in addition to the shape and number of the tab wires 7a, 7b.

Figure 3:
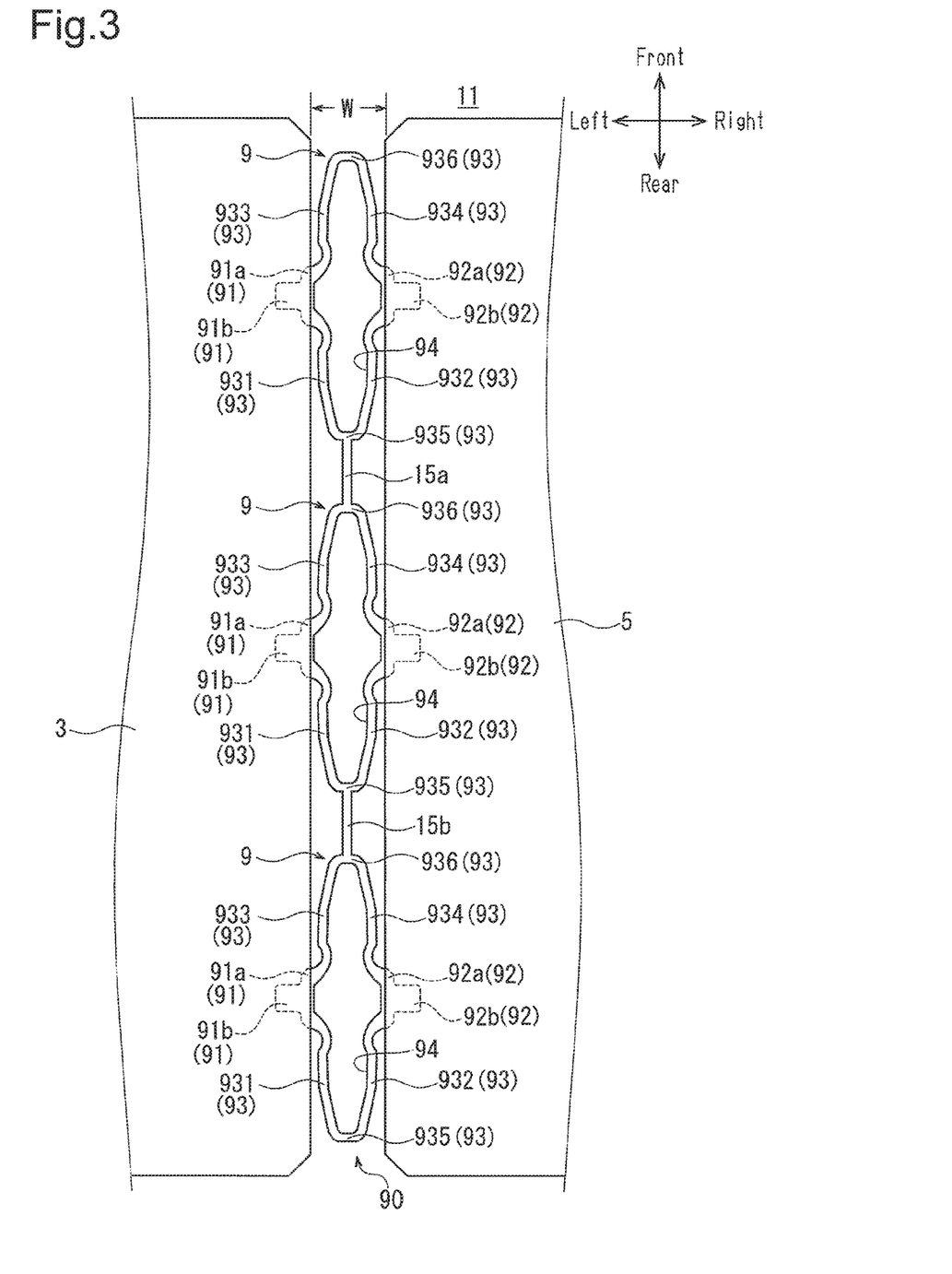
FIG. 3 is an enlarged top view showing a first photovoltaic cell, a second photovoltaic cell, and interconnectors of the solar panel shown in FIG. 1.

As shown in FIG. 3, the three interconnectors 9 are connected by the first link 15a and the second link 15b to form an interconnector group 90. The interconnector group 90, that is, the three interconnectors 9 and the first and second links 15a, 15b, is integrally formed by stamping a copper plate. The interconnector group 90 is flat and parallel to the first photovoltaic cells 3 and the second photovoltaic cells 5 (refer to FIG. 2). Alternatively, a metal plate that differs from the copper plate may be used to form the interconnector group 90. The number of the interconnectors 9 forming the interconnector group 90 may be changed as long as the number is two or greater.

Figure 4:
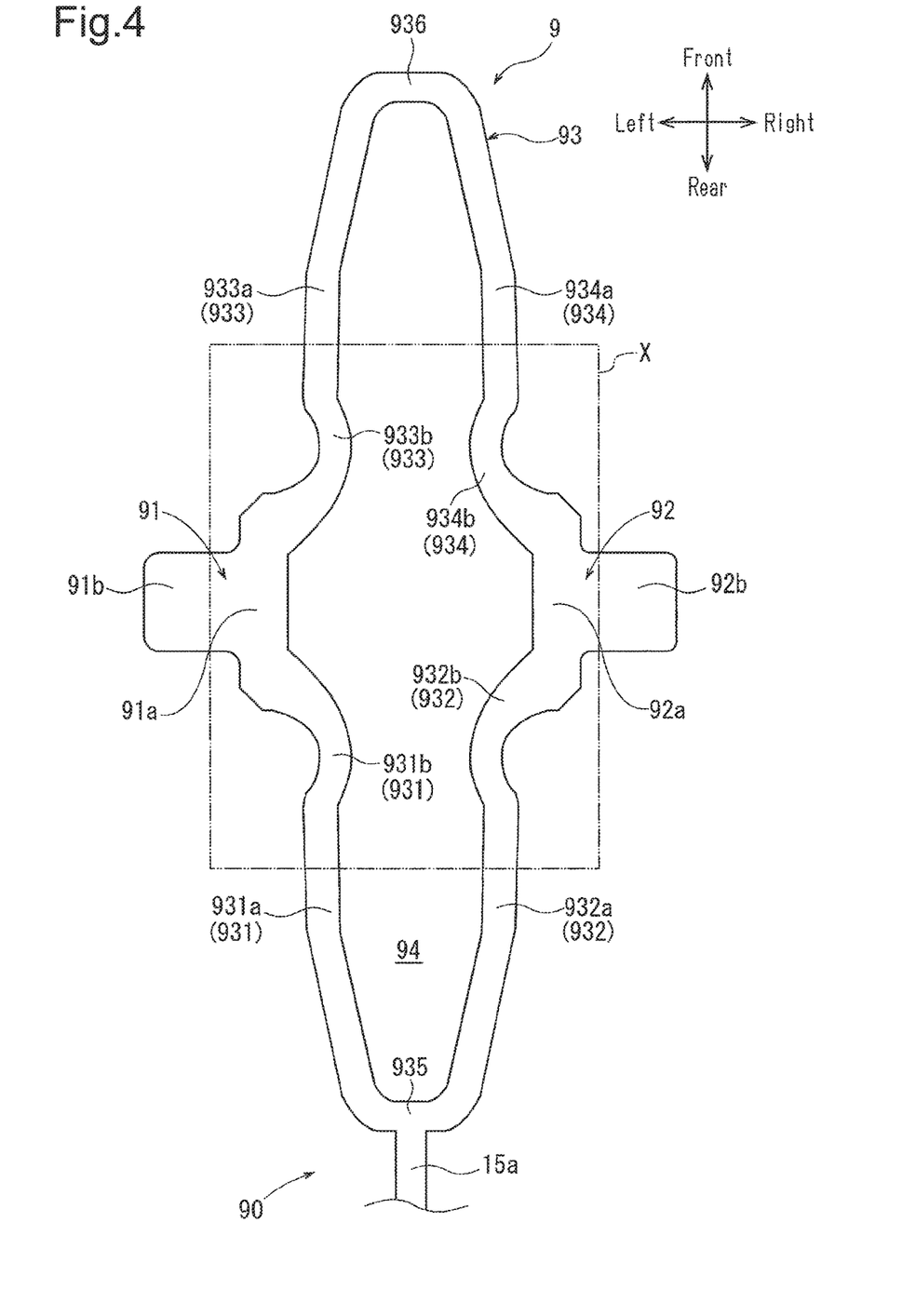
FIG. 4 is an enlarged top view showing one of the interconnectors shown in FIG. 3.

As shown in FIG. 4, the interconnector 9 includes a first electrode 91, a second electrode 92, and a connection body 93. The first electrode 91, the second electrode 92, and the connection body 93 are formed integrally with each other by stamping a copper plate as described above.

The first electrode 91 is located at the left side of the interconnector 9. The second electrode 92 is located at the right side of the interconnector 9. The first electrode 91 includes a first base 91a, which extends in the front-rear direction of the interconnector 9, and a first contact portion 91b, which is integral with the first base 91a and extended leftward from the first base 91a. The second electrode 92 includes a second base 92a, which extends in the front-rear direction of the interconnector 9, and a second contact portion 92b, which is integral with the second base 92a and extended rightward from the second base 92a.

The connection body 93 has the form of a fine line in a plan view. The connection body 93 includes a rear first detour 931, a rear second detour 932, a front first detour 933, a front second detour 934, a first joint 935, and a second joint 936. The rear first detour 931 and the rear second detour 932 are located at one side in the second direction. The front first detour 933 and the front second detour 934 are located at the other side in the second direction. The rear first detour 931 and the front first detour 933 are located at the left side of the connection body 93. The rear first detour 931 and the front first detour 933 separated from each other in the front-rear direction. The rear second detour 932 and the front second detour 934 are located at the right side of the connection body 93. The rear second detour 932 and the front second detour 934 are also separated from each other in the front-rear direction. The first joint 935 is located on a rear end of the connection body 93. The second joint 936 is located on a front end of the connection body 93.

Each of the rear first detour 931 and the rear second detour 932 extends as a single line toward the rear of the interconnector 9. Each of the front first detour 933 and the front second detour 934 extends as a single line toward the front of the interconnector 9. The rear first detour 931 includes a rear first body part 931a and a rear first curved part 931b. The rear second detour 932 includes a rear second body part 932a and a rear second curved part 932b. The front first detour 933 includes a front first body part 933a and a front first curved part 933b. The front second detour 934 includes a front second body part 934a and a front second curved part 934b. The rear first curved part 931b and the front first curved part 933b each correspond to a first curved part. The rear second curved part 932b and the front second curved part 934b each correspond to a second curved part.

The rear first detour 931 and the front first detour 933 are symmetrical at front and rear sides of the interconnector 9. In the same manner, the rear second detour 932 and the front second detour 934 are symmetrical at the front and rear sides. Thus, hereafter, the structures of the rear first detour 931 and the rear second detour 932 will be described in detail. The structures of the front first detour 933 and the front second detour 934 will not be described in detail.

Figure 5:
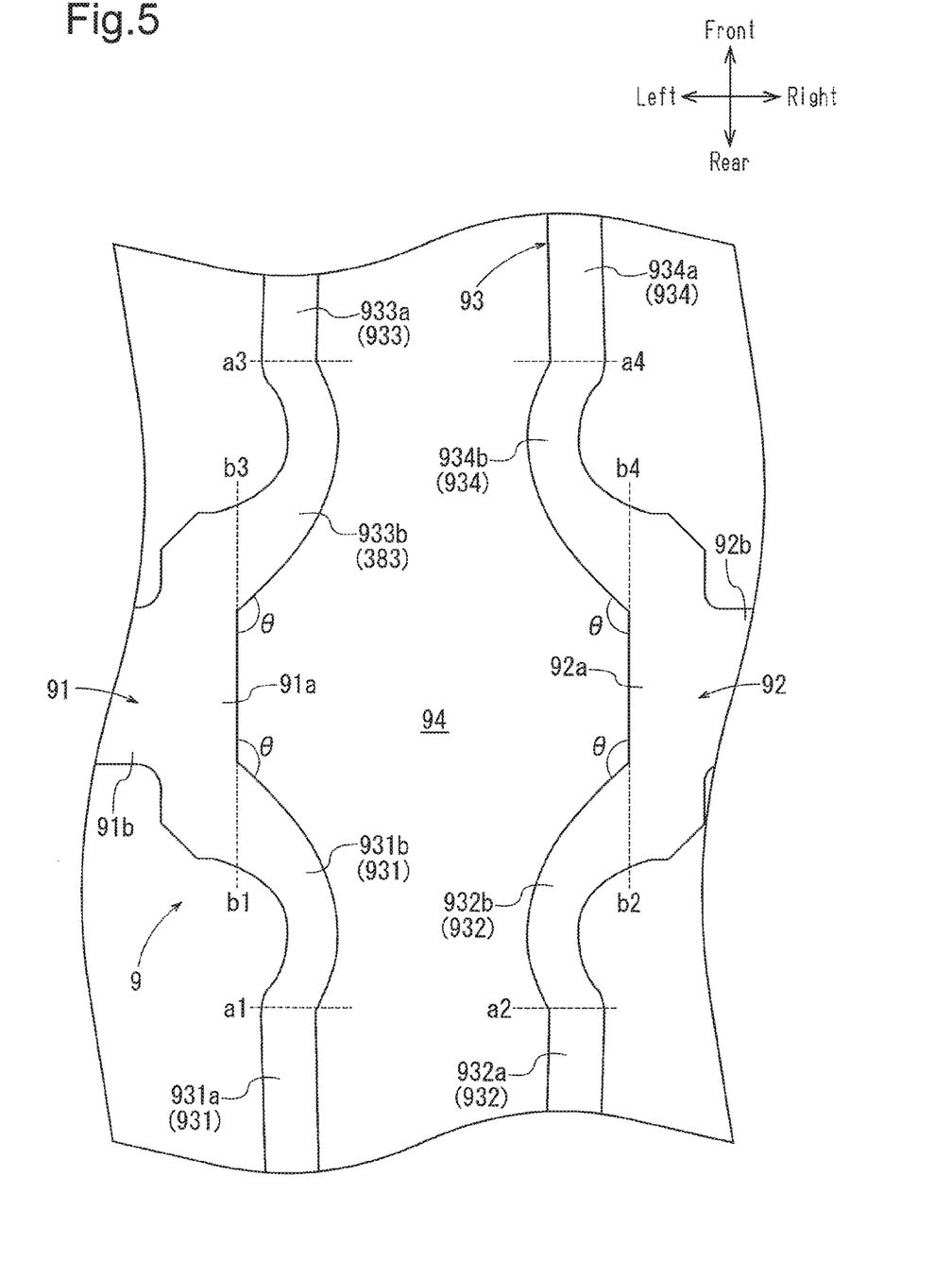
FIG. 5 is a partially enlarged top view showing a region X of FIG. 4.

The rear first body part 931a linearly extends from the rear first curved part 931b toward the rear of the interconnector 9 and then gradually toward the rear second detour 932. The rear first curved part 931b is located on a side of the rear first detour 931 corresponding to the first electrode 91. More specifically, the rear first curved part 931b corresponds to a front region of the rear first detour 931. FIG. 5 shows an enlarged view of a region X shown in FIG. 4. The rear first curved part 931b is, more specifically, a part of the rear first detour 931 defined by broken lines a1, b1 of FIG. 5. The rear end of the rear first curved part 931b is connected to the front end of the rear first body part 931a. The rear first curved part 931b is curved rightward from the front end of the rear first body part 931a toward the rear second detour 932 and then toward the first electrode 91, more specifically, largely curved leftward, that is, toward a side opposite to the second electrode 92. The rear first curved part 931b is curved to bulge toward the rear second curved part 932b. The front end of the rear first curved part 931b is connected to a rear end region of the first base 91a of the first electrode 91 from the right. More specifically, the right edge of the rear first curved part 931b is curved and connected to the right edge of the first base 91a at an angle θ that is greater than the right angle. In the present embodiment, the angle θ is set to approximately 120°. The angle θ may be set to any value that is greater than 90°. The left edge of the rear first curved part 931b is curved and connected to the rear edge of the first base 91a.

As shown in FIG. 4, the rear second detour 932 and the rear first detour 931 are symmetrical at the left and right sides. More specifically, the rear second body part 932a linearly extends from the rear second curved part 932b toward the rear of the interconnector 9 and then gradually toward the rear first detour 931. The rear second curved part 932b is located on a side of the rear second detour 932 corresponding to the second electrode 92. That is, the rear second curved part 932b corresponds to a front region of the rear second detour 932. More specifically, as shown in FIG. 5, the rear second curved part 932b is a part of the rear second detour 932 defined by broken lines a2, b2 of FIG. 5. The rear end of the rear second curved part 932b is connected to the front end of the rear second body part 932a. The rear second curved part 932b is curved leftward from the front end of the rear second body part 932a toward the rear first detour 931 and then toward the second electrode 92, more specifically, largely curved rightward, that is, toward a side opposite to the first electrode 91. The rear second curved part 932b is curved to bulge toward the rear first curved part 931b. The front end of the rear second curved part 932b is connected to a rear region of the second base 92a of the second electrode 92 from the left. In this state, in the same manner as the rear first curved part 931b described above, the left edge of the rear second curved part 932b is curved and connected to the left edge of the second base 92a at the angle θ. Also, the right edge of the rear second curved part 932b is curved and connected to the rear edge of the second base 92a.

As shown in FIG. 4, the front first curved part 933b is located on a side of the front first detour 933 corresponding to the first electrode 91. More specifically, the front first curved part 933b corresponds to a rear region of the front first detour 933. The front second curved part 934b is located on a side of the front second detour 934 corresponding to the second electrode 92. That is, the front second curved part 934b corresponds to a rear region of the front second detour 934. More specifically, the front first curved part 933b is a part of the front first detour 933 defined by broken lines a3, b3 shown in FIG. 5. In the same manner as the rear first curved part 931b, the front first curved part 933b is curved toward a side opposite to the second electrode 92. In other words, the front first curved part 933b is curved to bulge toward the front second curved part 934b. The right edge of the front first curved part 933b is curved and connected to the right edge of the first base 91a from the right at the angle θ. The left edge of the front first curved part 933b is curved and connected to the front edge of the first base 91a. The front second curved part 934b is a part of the front second detour 934 defined by broken lines a4, b4 shown in FIG. 5. In the same manner as the rear second curved part 932b, the front second curved part 934b is curved toward the side opposite to the first electrode 91. In other words, the front second curved part 934b is curved to bulge toward the front first curved part 933b. The left edge of the front second curved part 934b is curved and connected to the left edge of the second base 92a from the left at the angle θ. The right edge of the front second curved part 934b is curved and connected to the front edge of the second base 92a. As described above, the rear first detour 931 and the front first detour 933 are connected to the first electrode 91. The rear second detour 932 and the front second detour 934 are connected to the second electrode 92.

As shown in FIG. 4, the first joint 935, which linearly extends as a single line in the left-right direction, is connected to the rear end of the rear first body part 931a and the rear end of the rear second body part 932a. In the same manner, the second joint 936, which linearly extends as a single line in the left-right direction, is connected to the front end of the front first body part 933a and the front end of the front second body part 934a. In the connection body 93, the rear first detour 931 and the rear second detour 932 are joined by the first joint 935. The front first detour 933 and the front second detour 934 are joined by the second joint 936. Thus, in the interconnector 9, the connection body 93 electrically connects the first electrode 91 and the second electrode 92.

As described above, when the connection body 93 connects the first electrode 91 and the second electrode 92, a gap 94 extends in a central portion of the interconnector 9. The gap 94 deforms in the front-rear and left-right directions in accordance with deformation of the interconnector 9 in the front-rear and left-right directions. The gap 94 spaces apart the group of the rear first detour 931, the first electrode 91, and the front first detour 933 from the group of the rear second detour 932, the second electrode 92, and the front second detour 934 in the left-right direction.

As shown in FIG. 3, the first link 15a connects the foremost one of the three interconnectors 9 forming the interconnector group 90 and the second foremost one of the three interconnectors 9 forming the interconnector group 90. More specifically, the first link 15a is connected to the first joint 935 of the foremost interconnector 9 and the second joint 936 of the second foremost interconnector 9. Also, in the same manner, the second link 15b is connected to the first joint 935 of the second foremost one of the three interconnectors 9 forming the interconnector group 90 and the second joint 936 of the third foremost one of the three interconnectors 9 forming the interconnector group 90.

In each of the interconnectors 9, the first electrode 91 is connected to the first photovoltaic cell 3 so that the conductive portion of the first photovoltaic cell 3 is electrically connected to the first contact portion 91b. Also, the second electrode 92 is connected to the second photovoltaic cell 5 so that the conductive portion of the second photovoltaic cell 5 is electrically connected to the second contact portion 92b. As described above, the lower surface 3b of each first photovoltaic cell 3 and the lower surface 5b of each second photovoltaic cell 5 include the conductive portions. Thus, as shown in FIG. 2, the first electrode 91 is connected to the lower surface 3b of the first photovoltaic cell 3. In the same manner, the second electrode 92 is connected to the lower surface 5b of the second photovoltaic cell 5. To simplify the illustration, the shape of the interconnector 9 is simplified in FIGS. 2 and 6 to 8. Alternatively, the upper surface 3a of each first photovoltaic cell 3 and the upper surface 5a of each second photovoltaic cell 5 may include the conductive portions. In this case, when the first electrode 91 is connected to the upper surface 3a of the first photovoltaic cell 3, the second electrode 92 may be connected to the upper surface 5a of the second photovoltaic cell 5.

As shown in 3, the interconnector group 90 is located between the first photovoltaic cell 3 and the second photovoltaic cell 5. Additionally, as shown in FIG. 2, the interconnector group 90 is located parallel to the first photovoltaic cell 3 and the second photovoltaic cell 5. In the solar panel, adjacent ones of the first photovoltaic cells 3 and the second photovoltaic cells 5 in the left-right direction are connected to the interconnector group 90, ultimately, the interconnectors 9. As shown in FIG. 3, the first photovoltaic cell 3 and the second photovoltaic cell 5 are separated from each other by the interval W. The interconnector group 90 is located between the first photovoltaic cell 3 and the second photovoltaic cell 5.

The encapsulation member 11, which is shown in FIG. 2, includes ethylene-vinyl acetate copolymer (EVA). The encapsulation member 11 includes encapsulation sheets 11a, 11b, which will be described later. The first and second photovoltaic cells 3, 5, the tab wires 7a, 7b, and the interconnector group 90 are located between the protection plate 1 and the back panel 13, more specifically, between the lower surface 1b of the protection plate 1 and an upper surface 13a of the back panel 13. The first and second photovoltaic cells 3, 5, the tab wires 7a, 7b, and the interconnector group 90 are encapsulated and fixed to one another by the encapsulation member 11. Thus, the encapsulation member 11 is integrated with the protection plate 1 and the back panel 13 while protecting the first and second photovoltaic cells 3, 5 from wear caused by, for example, moisture or oxygen. The encapsulation member 11 also includes a first silicon resin 17a and a second silicon resin 17b, which will be described later. The first silicon resin 17a and the second silicon resin 17b correspond to a first adhesive and a second adhesive, respectively. The encapsulation member 11 may include, for example, an ionomer resin, a silicon resin, or polyolefin, instead of EVA described above.

The back panel 13 is formed by a metal plate of, for example, an aluminum alloy. The back panel 13 is flat and tetragonal. The back panel 13 includes the upper surface 13a, which is opposed to the lower surface 1b of the protection plate 1, the first and second photovoltaic cells 3, 5, and the encapsulation member 11, and a lower surface 13b, which is opposite to the upper surface 13a. The back panel 13, which is located at a lower surface side of the encapsulation member 11, protects the first and second photovoltaic cells 3, 5 from wear caused by, for example, moisture or oxygen together with the encapsulation member 11. Additionally, the back panel 13 increases the rigidity of the solar panel. Thus, even when the protection plate 1 is not adequately rigid, the rigidity of the solar panel is ensured. Alternatively, the back panel 13 may be formed by a resin such as carbon fiber reinforced plastic (CFRP). When the protection plate 1 is formed from a resin as described above and the back panel 13 is also formed from a resin, the protection plate 1 and the back panel 13 may together have a structure that ensures the required rigidity of the solar panel. When the protection plate 1 is rigid enough to ensure the rigidity of the solar panel, for example, a thin film formed from polyetherketone (PEK) may be used as the back cover instead of the back panel 13.

The first and second photovoltaic cells 3, 5 are adhered to the back panel 13 by the first and second silicon resins 17a, 17b, respectively. More specifically, the first silicon resin 17a adheres the upper surface 13a of the back panel 13 to the lower surface 3b of each first photovoltaic cell 3. The second silicon resin 17b adheres the upper surface 13a of the back panel 13 to the lower surface 5b of each second photovoltaic cell 5. The first silicon resin 17a and the second silicon resin 17b may have the same material. Alternatively, the first silicon resin 17a and the second silicon resin 17b may have different materials taking into consideration other conditions.

Figure 6:
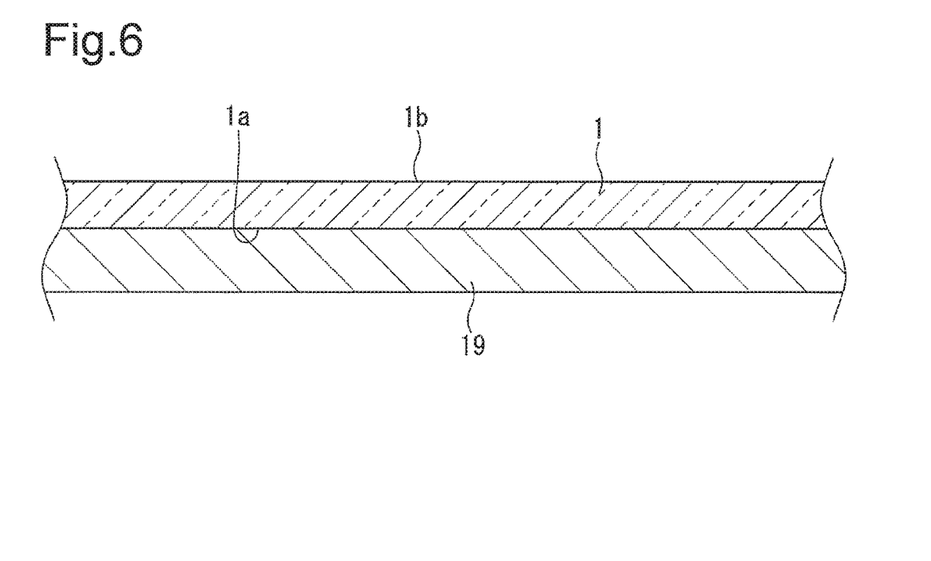
FIG. 6 is a cross-sectional view showing a preparing step of a process for manufacturing the solar panel of FIG. 1.

The solar panel is manufactured as described below. As shown in FIG. 6, a heatable vacuum forming jig 19 is prepared as a preparing step. A preformed protection plate 1 is placed on the vacuum forming jig 19. In this step, the protection plate 1 is placed on the vacuum forming jig 19 with the upper surface 1a opposed to the vacuum forming jig 19.

Figure 7:
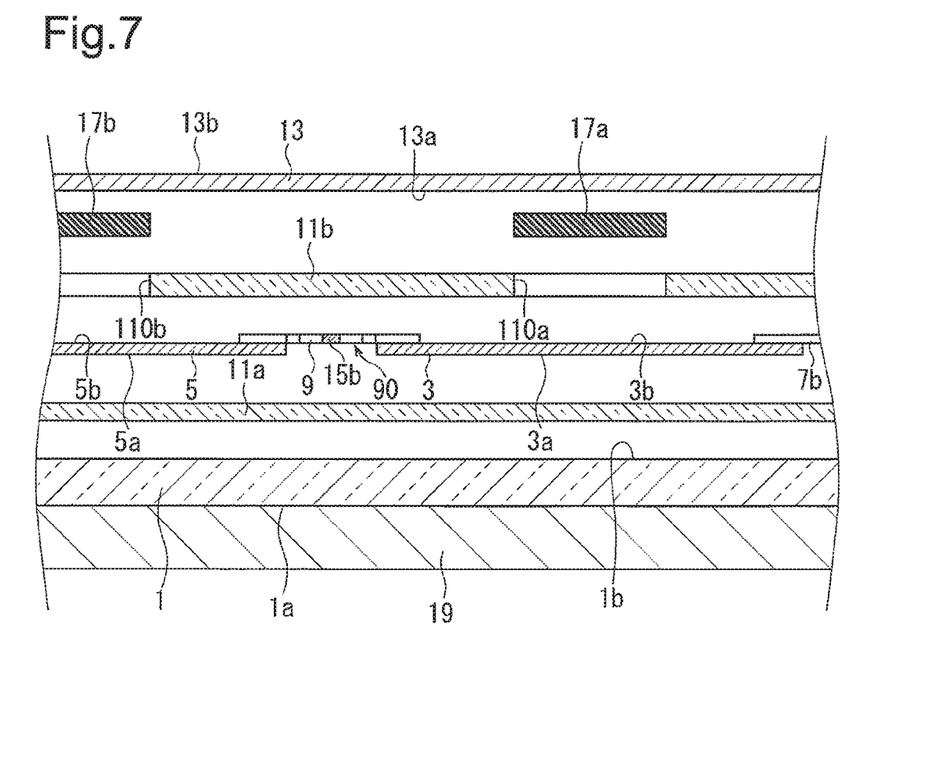
FIG. 7 is a cross-sectional view showing an encapsulating step of the process for manufacturing the solar panel of FIG. 1.

As shown in FIG. 7, as an encapsulating step, the encapsulation sheet 11a, the first and second photovoltaic cells 3, 5, the tab wires 7a, 7b, the interconnector group 90, and the encapsulation sheet 11b are sequentially placed on the lower surface 1b of the protection plate 1. The first and second photovoltaic cells 3, 5 are electrically connected to each other by the tab wires 7a, 7b and the interconnector group 90.

The encapsulation sheet 11b includes first cutaway portions 110a in positions opposed to the lower surfaces 3b of the first photovoltaic cells 3 and second cutaway portions 110b in position opposed to the lower surfaces 5b of the second photovoltaic cells 5. The encapsulation sheet 11b includes the first cutaway portions 110a and the second cutaway portions 110b in accordance with the number of the first photovoltaic cells 3 and the second photovoltaic cells 5, respectively. Each of the first cutaway portions 110a is filled with the first silicon resin 17a. Each of the second cutaway portions 110b is filled with the second silicon resin 17b. Then, the back panel 13 is placed on the encapsulation sheet 11b with the upper surface 13a opposed to the lower surface 1b of the protection plate 1.

Figure 8:
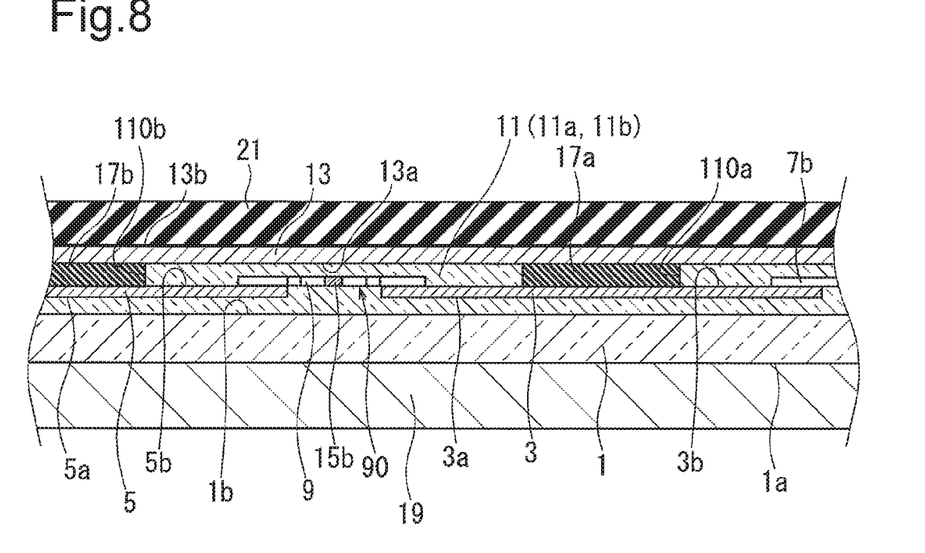
FIG. 8 is a cross-sectional view showing a laminating step of the process for manufacturing the solar panel of FIG. 1.

As shown in FIG. 8, a laminating step is performed. More specifically, as shown in FIG. 8, while a diaphragm 21 is pressed onto the vacuum forming jig 19, a vacuum state is obtained between the vacuum forming jig 19 and the diaphragm 21, that is, between the components of the solar panel described above. Additionally, at the same time as the pressing of the diaphragm 21, the vacuum forming jig 19 is heated to soften the encapsulation sheets 11a, 11b and adhere the components to each other. Consequently, the first and second photovoltaic cells 3, 5, the tab wires 7a, 7b, and the interconnector group 90, which are located between the lower surface 1b of the protection plate 1 and the upper surface 13a of the back panel 13, encapsulated and fixed to each other. Additionally, the first silicon resin 17a adheres the first photovoltaic cells 3 to the back panel 13, and the second silicon resin 17b adheres the second photovoltaic cells 5 to the back panel 13. As a result, the solar panel is completed.

As shown in FIG. 3, in the solar panel, the interconnector group 90 electrically connects adjacent ones of the first photovoltaic cells 3 and the second photovoltaic cells 5 in the left-right direction. In each interconnector 9 of the interconnector group 90, the first electrode 91 and the second electrode 92 are connected by the connection body 93. Thus, when the solar panel is thermally expanded or contracted by changes in the temperature during the manufacturing or use of the solar panel, if the interval W is narrowed or widened between the first photovoltaic cell 3 and the second photovoltaic cell 5 from the state shown in FIG. 3, the interval of the first electrode 91 and the second electrode 92 in the interconnector 9 is changed in accordance with the interval W.

More specifically, when changes in the temperature contract the solar panel, the first photovoltaic cell 3 and the second photovoltaic cell 5 become closer to each other in the left-right direction. This narrows the interval W of the first photovoltaic cell 3 and the second photovoltaic cell 5 from the state shown in FIG. 3. Accordingly, the connection body 93 of the interconnector 9 is deformed like a pantograph. More specifically, the rear first detour 931 and the rear second detour 932 are deformed to be closer to each other than the state shown in FIGS. 3 and 4 in the left-right direction. The front first detour 933 and the front second detour 934 are deformed to be closer to each other in the left-right direction. Therefore, when the contraction of the solar panel narrows the interval of the first photovoltaic cell 3 and the second photovoltaic cell 5 caused by changes in the temperature, the first detours 931, 933 and the second detours 932, 934 are deformed to be closer to each other in the left-right direction. Consequently, the gap 94 in the central portion of each interconnector 9 is narrower than the state shown in FIGS. 3 and 4, and the first electrode 91 and the second electrode 92 are located closer to each other in the left-right direction.

When the solar panel contracts, the rear first and second detours 931, 932 and the front first and second detours 933, 934 are deformed so that the first electrode 91 and the second electrode 92 become closer to each other in the left-right direction while buffering the compression load applied by the first photovoltaic cell 3 and the second photovoltaic cell 5 to the interconnector 9 in the left-right direction. Thus, in the solar panel, even when the interval is narrowed between the first photovoltaic cell 3 and the second photovoltaic cell 5, the narrowed interval will not break the interconnectors 9 in the thickness-wise direction.

When changes in the temperature expand the solar panel, the first photovoltaic cell 3 the second photovoltaic cell 5 are moved away from each other in the left-right direction. This widens the interval W of the first photovoltaic cell 3 and the second photovoltaic cell 5 from the state shown in FIG. 3. Accordingly, in the connection body 93 of each interconnector 9, the rear first detour 931 and the rear second detour 932 are deformed and moved away from each other in the left-right direction as compared to the state shown in FIGS. 3 and 4. In the same manner, the front first detour 933 and the front second detour 934 are deformed and moved away from each other in the left-right direction. Thus, in the interconnector 9, the central gap 94 becomes wider than the state shown in FIGS. 3 and 4, and the first electrode 91 and the second electrode 92 are moved away from each other in the left-right direction. In the interconnector 9, when the solar panel expands, the rear first and second detours 931, 932 and the front first and second detours 933, 934 are deformed so that the first electrode 91 and the second electrode 92 are moved away from each other in the left-right direction while buffering the tension load applied from the first photovoltaic cell 3 and the second photovoltaic cell 5 to the interconnector 9 in the left-right direction. Thus, in the solar panel, even when the interval is widened between the first photovoltaic cell 3 and the second photovoltaic cell 5, the widened interval will not separate the first electrode 91 from the first photovoltaic cell 3 and the second electrode 92 from the second photovoltaic cell 5.

Additionally, in the connection body 93, the four detours of the rear first and second detours 931, 932 and the front first and second detours 933, 934 are each deformed. Thus, the interconnectors 9 easily change the distance between the first photovoltaic cell 3 and the second photovoltaic cell 5 in a uniform manner.

The position where the rear first detour 931 is connected to the first base 91a of the first electrode 91 is separated from the position where the front first detour 933 is connected to the first base 91a of the first electrode 91 in the front-rear direction. Also, the position where the rear second detour 932 is connected to the second base 92a of the second electrode 92 is separated from the position where the front second detour 934 is connected to the second base 92a of the second electrode 92 in the front-rear direction. Thus, in each of the interconnectors 9, the rear first detour 931 and the front first detour 933 are independently deformable. Also, the rear second detour 932 and the front second detour 934 are independently deformable. This facilitates the deformation of the rear first and second detours 931, 932 and the front first and second detours 933, 934 as described above. Accordingly, the first electrode 91 and the second electrode 92 are easily moved closer to and away from each other in the left-right direction.

The rear first detour 931 includes the rear first curved part 931b. The rear second detour 932 includes the rear second curved part 932b. The right edge of the rear first curved part 931b is curved and connected to the right edge of the first base 91a of the first electrode 91 from the right at the angle θ. The left edge of the rear first curved part 931b is curved and connected to the rear edge of the first base 91a. The left edge of the rear second curved part 932b is curved and connected to the left edge of the second base 92a of the second electrode 92 from the left at the angle θ. The right edge of the rear second curved part 932b is curved and connected to the rear edge of the second base 92a.

When the connection body 93 is deformed as described above, the rear first curved part 931b easily disperses stress in a favorable manner. This limits concentration of the stress on the position where the rear first detour 931 is connected to the first electrode 91. In the same manner, the concentration of stress on the position where the rear second detour 932 is connected to the second electrode 92 is limited. The concentration of stress also limited on the position where the front first detour 933 is connected to the first electrode 91 and the position where the front second detour 934 is connected to the second electrode 92. In the solar panel, the stress is hindered from breaking the rear first and second detours 931, 932 and the front first and second detours 933, 934 of each interconnector 9.

Therefore, even when the solar panel is expanded or contracted by changes in the temperature, the solar panel limits occurrence of defective electrical connections of the first photovoltaic cells 3 and the second photovoltaic cells 5.

In particular, the first electrode 91, the second electrode 92, and the connection body 93 are integrally formed by stamping a copper plate. Thus, the first electrode 91, the second electrode 92, and the connection body 93 are formed by a single plate. This facilitates the manufacturing of the interconnectors 9, ultimately, the interconnector group 90. Thus, the manufacturing cost of the solar panel may be reduced.

In each interconnector 9, the connection body 93 includes a single line of the rear first detour 931, a single line of the rear second detour 932, a single line of the front first detour 933, a single line of the front second detour 934, a single line of the first joint 935, and a single line of the second joint 936. The connection body 93 has the form of a fine line in a plan view. Thus, in the interconnector 9, the structure of the connection body 93 may be simplified.

For example, the connection body and the entire interconnector may be spirally shaped or the entire interconnector may be mesh-shaped so that when changes in the temperature expand or contract the solar panel, the interconnector is deformable following the expansion or contraction. However, in such a configuration, the shapes of the connection body and the entire interconnector are complex, and the interconnector has a number of voids. This hinders the encapsulation member from entering the voids in the interconnector in the laminating step. Thus, air bubbles tend to be formed between the encapsulation member and the interconnector. As a result, the bonding strength may be decreased between the encapsulation member and the interconnector. When the air bubbles are exposed in the ornamental surface of the solar panel, the aesthetic appeal of the solar panel is decreased.

In this regard, in the solar panel of the first embodiment, the connection body 93 of each interconnector 9 has the form of a fine line as described above. This hinders the formation of air bubbles between the encapsulation sheets 11a, 11b and the interconnector 9 in the laminating step. Thus, in the solar panel, in addition to obtaining the adequate bonding of the encapsulation sheets 11a, 11b to the interconnector 9, the aesthetic appeal will not be decreased by air bubbles that would be exposed in the ornamental surface of the solar panel.

In the solar panel, while the first silicon resin 17a adheres the first photovoltaic cells 3 to the back panel 13, the second silicon resin 17b adheres the second photovoltaic cells 5 to the back panel 13. Thus, the positioning of the first photovoltaic cells 3 and the second photovoltaic cells 5 are easily performed when manufacturing the solar panel. Additionally, when the back panel 13 is expanded or contracted by changes in the temperature during the manufacturing or use of the solar panel, the first photovoltaic cells 3 and the second photovoltaic cells 5 are movable following the back panel 13. Thus, in the solar panel, misalignments of the first photovoltaic cells 3 and the second photovoltaic cells 5 with the protection plate 1 are limited. Therefore, even when the solar panel is expanded or contracted by changes in the temperature, situations in which the first photovoltaic cells 3 and the second photovoltaic cells 5 are hidden by the body portion 10a or the connection portions 10b of the shield 10 as a result of the expansion or contraction are limited.

The lower surfaces 3b of the first photovoltaic cells 3 and the lower surfaces 5b of the second photovoltaic cells 5 adhere to the back panel 13. Thus, the first and second silicon resins 17a, 17b will not be seen when the solar panel is viewed from the upper surface 1a of the protection plate 1. This increases the aesthetic appeal of the solar panel.

The solar panel includes a plurality of interconnector groups 90. Each of the interconnector groups 90 include the three interconnectors 9, which are connected by the first and second links 15a, 15b. In the interconnector group 90, the first and second links 15a, 15b may set intervals of the interconnectors 9 to be uniform in the front-rear direction. Thus, with the solar panel, the interconnectors 9 are easily positioned in the front-rear direction, for example, as compared to when three independent interconnectors 9 connect the first photovoltaic cell 3 and the second photovoltaic cell 5 that are adjacent to each other in the left-right direction. In other words, in the solar panel, when the interconnector group 90 connects the first photovoltaic cell 3 and the second photovoltaic cell 5, the positioning of the interconnectors 9 in the front-rear direction does not have to be separately performed.

Second Embodiment

Figure 9:
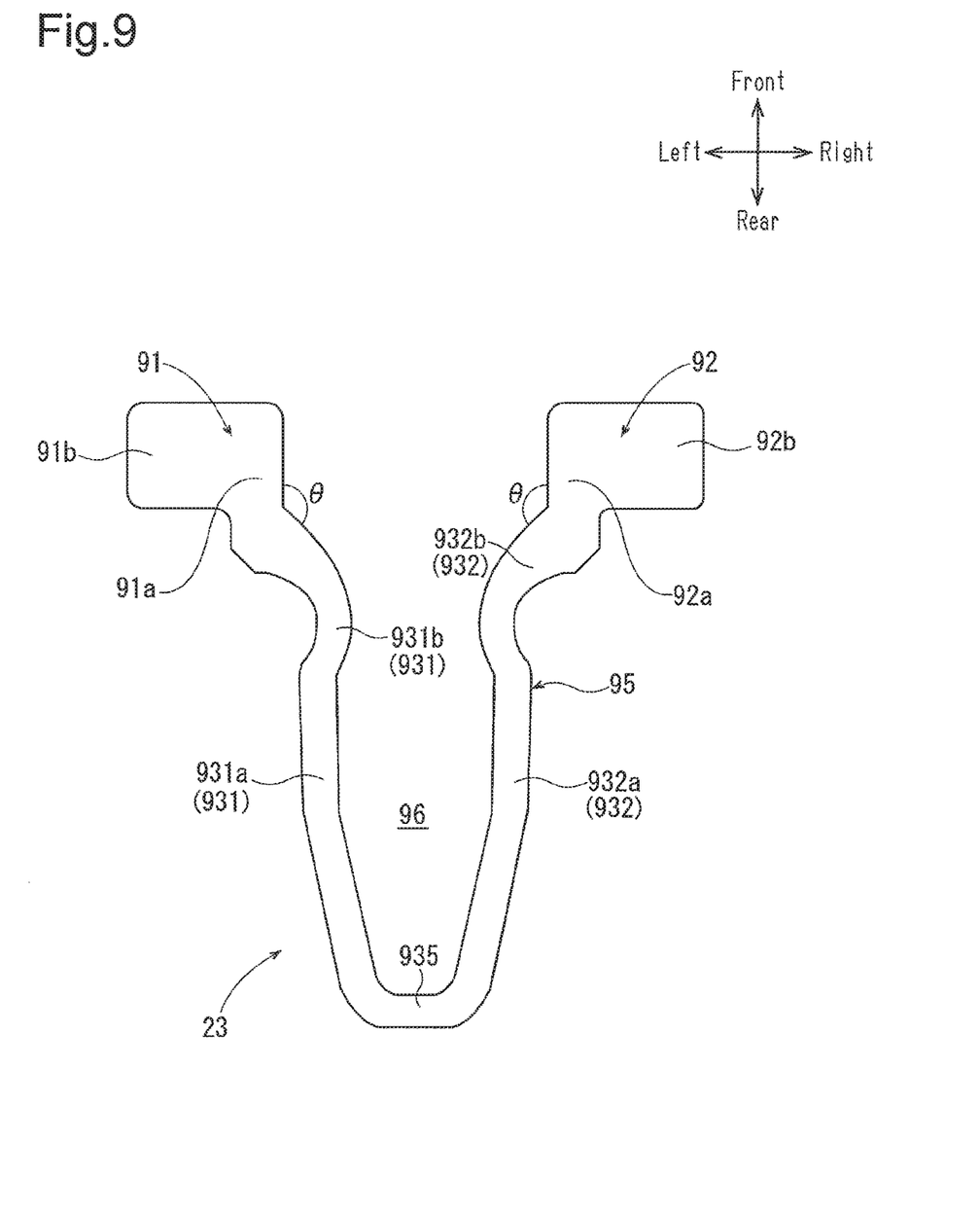
FIG. 9 is an enlarged top view showing an interconnector of a second embodiment of a solar panel.

As shown in FIG. 9, a second embodiment of a solar panel includes a plurality of interconnectors 23 instead of the interconnector group 90 of the solar panel of the first embodiment. The interconnectors 23 are also formed by stamping a copper plate. The number of interconnectors 23 may be changed.

Each of the interconnectors 23 includes the first electrode 91, the second electrode 92, and a connection body 95. In the interconnectors 23 of the second embodiment, which differ from the interconnectors 9 of the first embodiment, the first base 91a of the first electrode 91 and the second base 92a of the second electrode 92 only extend toward the rear of each interconnector 23.

The connection body 95 includes the rear first detour 931, the rear second detour 932, and the first joint 935, which are described above. In the interconnector 23, the connection body 95 connects the first electrode 91 and the second electrode 92. A gap 96 extends in a central portion of the interconnector 23. The gap 96 spaces apart a group of the rear first detour 931 and the first electrode 91 from a group of the rear second detour 932 and the second electrode 92 in the left-right direction. The remaining structure of the solar panel is the same as that of the solar panel of the first embodiment.

The interconnectors 23 have the same operation as the interconnectors 9. Additionally, the connection body 95 of each interconnector 23 includes the rear first and second detours 931, 932 and the first joint 935. Thus, the interconnectors 23 are more easily formed than the interconnectors 9, ultimately, the interconnector group 90. This reduces the manufacturing cost of the solar panel of the second embodiment, which includes the interconnectors 23.

The above description of the first and second embodiments is not intended to limit the present invention to the first and second embodiments. The embodiments may be modified and applied without departing from the scope of the invention.

For example, in the first embodiment of the solar panel, the three interconnectors 9 are connected by the first and second links 15a, 15b to form the interconnector group 90. Instead, the three interconnectors 9 may be independent from each other. Additionally, a plurality of interconnectors 23 of the solar panel of the second embodiment may be connected to form an interconnector group.

In the interconnectors 9 of the solar panel of the first embodiment, the first and second joints 935, 936 may be curved like an arc and extended in the left-right direction. The interconnectors 23 of the solar panel of the second embodiment may also be modified in the same manner.

The interconnectors 9 of the solar panel of the first embodiment may have a structure in which, for example, only the rear first detour 931 includes the rear first curved part 931b. The interconnectors 23 of the solar panel of the second embodiment may also be modified in the same manner.

In each interconnector 9 of the solar panel of the first embodiment, the rear first body part 931a may linearly extend from the rear first curved part 931b toward the rear of the interconnector 9 and then gradually away from the rear second detour 932. Also, the rear second body part 932a may linearly extend from the rear second curved part 932b toward the rear of the interconnector 9 and then gradually away from the rear first detour 931. The front first body part 933a and the front second body part 934a may also be modified in the same manner. Also, the interconnectors 23 of the solar panel of the second embodiment may be modified in the same manner.

The first silicon resin 17a may adhere the upper surfaces 3a of the first photovoltaic cells 3 to the lower surface 1b of the protection plate 1. The second silicon resin 17b may adhere the upper surfaces 5a of the second photovoltaic cells 5 to the lower surface 1b of the protection plate 1. In this case, it is preferred that the first and second silicon resins 17a, 17b be transparent to limit decreases in the power generation efficiency.

The solar panels of the first and second embodiments are not limited to flat panels and may be curved.

The present invention is applicable to a solar panel used in various types of solar photovoltaic system in addition to a solar panel installed on the roof of a vehicle.

Therefore, the present examples and embodiments are to be considered as illustrative and not restrictive and the invention is not to be limited to the details given herein, but may be modified within the scope and equivalence of the appended claims.

The invention claimed is:

1. An interconnector configured to electrically connect a first photovoltaic cell and a second photovoltaic cell, wherein the first photovoltaic cell and the second photovoltaic cell are adjacent to each other in a first direction, the first photovoltaic cell is located at a first side in the first direction, and the second photovoltaic cell is located at a second side in the first direction, the interconnector comprising:
   a first electrode configured to be connected to the first photovoltaic cell;
   a second electrode configured to be connected to the second photovoltaic cell; and
   a connection body that connects the first electrode and the second electrode, wherein
   the connection body includes
   a first detour connected to the first electrode and extended toward a first side in a second direction that is orthogonal to the first direction,
   a second detour connected to the second electrode and extended toward the first side in the second direction, and
   a joint extended in the first direction to connect the first detour and the second detour, and
   the first detour includes a first curved part that is curved toward the first side in the first direction and connected to the first electrode at an angle that is greater than a right angle, wherein
   the first detour includes a first body part linearly extending between the first curved part and the joint, and
   the first curved part extends from an end of the first body part toward the second side in the first direction, so that a portion of the first curved part is closer to the second electrode in the first direction compared to the end of the first body part, and then extends toward the first side in the first direction before connecting to the first electrode.

2. The interconnector according to claim 1, wherein the first curved part is curved to bulge toward the second detour.

3. The interconnector according to claim 1, wherein the second detour includes a second curved part that is curved toward the second side in the first direction and connected to the second electrode.

4. The interconnector according to claim 3, wherein
   the second detour includes a second body part extending between the second curved part and the joint, and the second curved part extends from the second body part toward the first side in the first direction and then toward the second side in the first direction before connecting to the second electrode.

5. The interconnector according to claim 3, wherein the second curved part is curved to bulge toward the first detour.

6. The interconnector according to claim 1, wherein
the first detour is one of two first detours, wherein the one of the two first detours extends from the first electrode toward the first side in the second direction, and the other one of the two first detours extends from the first electrode toward the second side in the second direction,
the second detour is one of two second detours, wherein the one of the two second detours extends from the second electrode toward the first side in the second direction, and the other one of the two second detours extends from the second electrode toward the second side in the second direction,
the joint corresponds to a first joint, and
the connection body further includes a second joint that connects the first detour that extends toward the second side in the second direction and the second detour that extends toward the second side in the second direction.

7. The interconnector according to claim 6, wherein
the first detour that extends toward the first side in the second direction is separated in the second direction from the first detour that extends toward the second side in the second direction, and
the second detour that extends toward the first side in the second direction is separated in the second direction from the second detour that extends toward the second side in the second direction.

8. The interconnector according to claim 1, wherein the first electrode, the second electrode, and the connection body are formed from a single plate.

9. A solar panel comprising:
the interconnector according to claim 1;
the first photovoltaic cell;
the second photovoltaic cell;
a protection cover including an upper surface and a lower surface, wherein the protection cover is transparent from the upper surface to the lower surface;
a back cover that cooperates with the protection cover to cover the first photovoltaic cell, the second photovoltaic cell, and the interconnector, which are located between the protection cover and the back cover; and
an encapsulation member that encapsulates the first photovoltaic cell, the second photovoltaic cell, and the interconnector and fixes the first photovoltaic cell, the second photovoltaic cell, and the interconnector to one another.

10. The solar panel according to claim 9, further comprising:
a first silicon resin that adheres the first photovoltaic cell to the back cover; and
a second silicon resin that adheres the second photovoltaic cell to the back cover.

11. The solar panel according to claim 10,
the first photovoltaic cell includes a lower surface adhered to the back cover, and
the second photovoltaic cell includes a lower surface adhered to the back cover.

* * * * *